United States Patent [19]

Huignard et al.

[11] 4,024,513
[45] May 17, 1977

[54] OPTICAL SYSTEM FOR THE STORAGE OF SELECTIVELY ERASABLE BINARY DATA ARRANGED IN THE FORM OF HOLOGRAPHICALLY RECORDED PAGES

[75] Inventors: Jean-Pierre Huignard; François Micheron, both of Paris, France

[73] Assignee: Thomson-CSF, Paris, France

[22] Filed: June 26, 1975

[21] Appl. No.: 590,824

[30] Foreign Application Priority Data

June 28, 1974  France .................. 74.22690

[52] U.S. Cl. .................. 340/173 LT; 340/173 LM; 350/3.5
[51] Int. Cl.² ...................... G03H 1/26; G03H 1/14
[58] Field of Search ............ 350/3.5; 340/173 LT, 340/173 LM

[56] References Cited
UNITED STATES PATENTS 3,915,549  10/1975  Amodei .................. 350/3.5
3,924,924  12/1975  Fukuhara .................. 350/3.5

OTHER PUBLICATIONS

Stroke, "Introduction to Coherent Optics and Holography," 2nd Ed., Academic Press, New York, 1969, pp. 90–96.
Collins, *Applied Optics*, vol. 7, No. 1, Jan. 1968, pp. 203–204.
Bromley, et al., *Applied Optics*, vol. 10, No. 1, Jan. 1971, pp. 174–181.

*Primary Examiner*—Ronald J. Stern
*Attorney, Agent, or Firm*—Cushman, Darby & Cushman

[57] ABSTRACT

The present invention relates to optical systems for the storage in the form of elementary holograms, of pages of binary data, said elementary hologram being stored in a two-dimensional or three-dimensional photosensitive medium. The system in accordance with the invention makes use of a photosensitive storage medium lending itself to the selective erasure of binary data, and which contains optical phase-shift devices which enable a phase-shift of 0° or 180° to be produced between the object beam and the reference beam depending upon whether it is desired to record or to erase the data.

12 Claims, 6 Drawing Figures

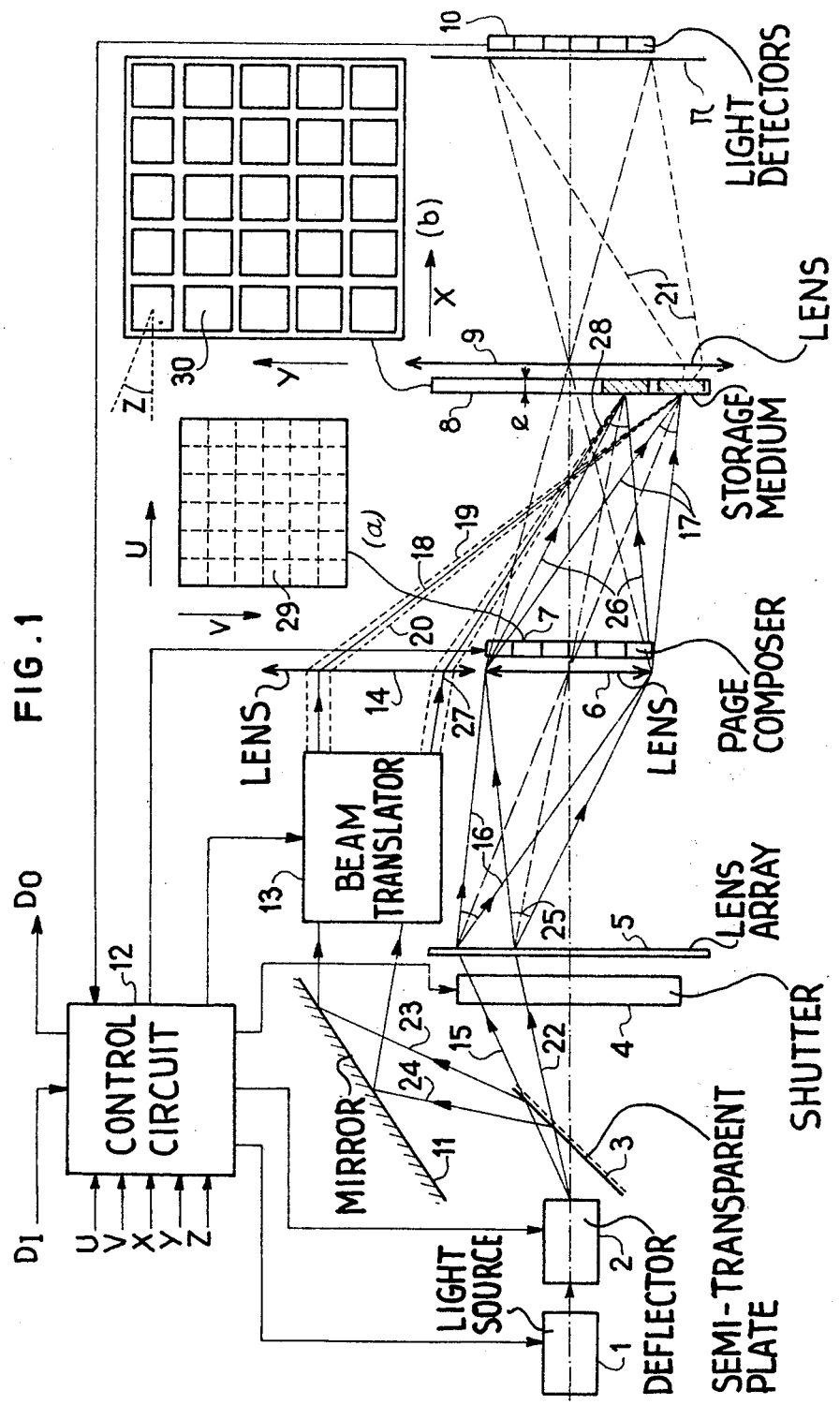

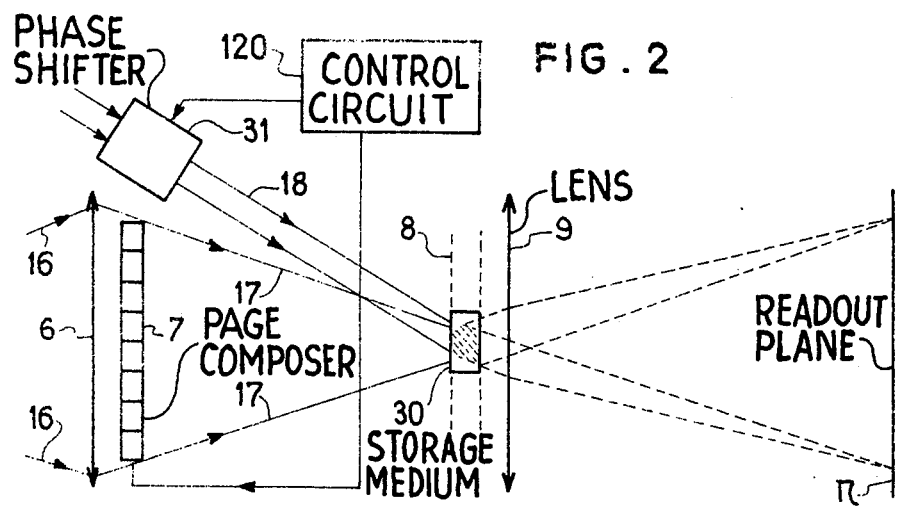
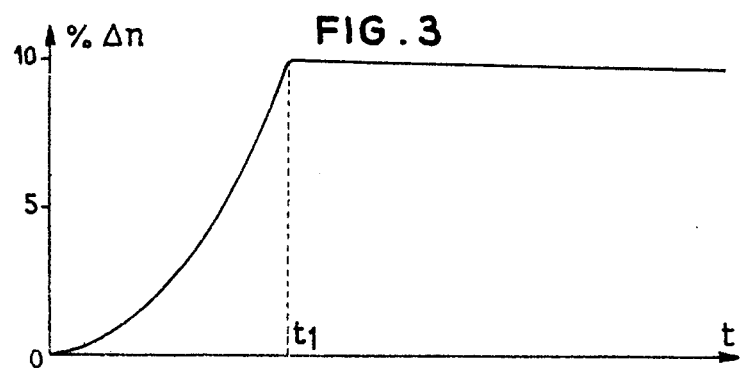
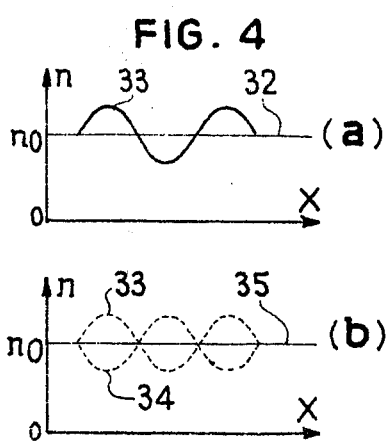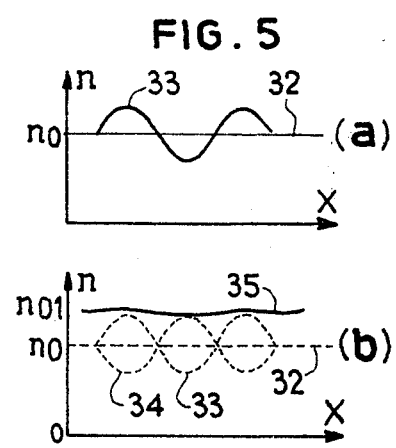

OPTICAL SYSTEM FOR THE STORAGE OF SELECTIVELY ERASABLE BINARY DATA ARRANGED IN THE FORM OF HOLOGRAPHICALLY RECORDED PAGES

The present invention relates to systems for the optical storage of binary data, which utilise high-density holographic recording in a two-dimensional or three-dimensional photosensitive material.

In the context of volumetric hologram storage, a very substantial storage density is achieved because use is made of the Bragg effect of angular selectivity, which makes it possible to superimpose within one and the same zone of the storage material, a large number of elementary holograms. Each elementary hologram represents a binary data page and since it is possible to provide large numbers of storage zones and large numbers of superimposed pages in each zone, it will be realised that the number of stored data is extremely high.

In known optical storage systems for binary data, the recording material used can be constituted by lithium niobate and if it is desired to erase the data contained in a zone, this can be done by uniform illumination or heating of said zone.

This technique of overall erasing by zone, has the drawback that many of the data which are not required to be erased, have to be re-recorded.

It is for this reason that a data storage system which enables a page or even a fraction of a page to be erased, would be of major significance. This selective erase facility would also make it possible to perform logic operations on the data of one or more pages, and this would constitute a further advantage in relation to known types of data storage systems.

In accordance with the present invention there is provided an optical storage system for selectively erasable binary data arranged in pages holographically recorded within a photosensitive medium, said system comprising:

a source of coherent radiation, a photosensitive medium for storing said binary data, first optical means splitting said coherent radiation into an object beam and a reference beam, a page composer device optically modulating said object beam in accordance with said binary data, second optical means causing said modulated object beam and said reference beam to intersect one another for effecting selective holographic recording of said pages within at least one portion of said photosensitive medium, and third optical means cooperating with said reference beam, for selectively reading out the elementary holograms photo-induced in said photosensitive medium; said photosensitive medium being constituted by an electrically birefringent material undergoing a change in refractive index photo-induced by said coherent radiation; said photo-induced change in refractive index being caused by a reversible optical damage effect occurring in relation with a spatial variation in the amplitude of said coherent radiation; said system further comprising optical phase-shift means acting upon the phase of one of said beams in order to introduce an optical phase-shift alternately acquiring the values 0 and $\pi$.

For a better understanding of the present invention and to show how the same may be carried into effect reference will be made to the ensuing description and the associated figures among which:

FIG. 1 illustrates the design of a known type of binary data storage system;

FIG. 2 illustrates the partial diagram of a selective erase system in accordance with the invention;

FIG. 3 illustrates the characteristic of a variation of the refractive index of a storage medium in accordance with the invention;

FIGS. 4 and 5 are explanatory diagrams;

Figure 6:
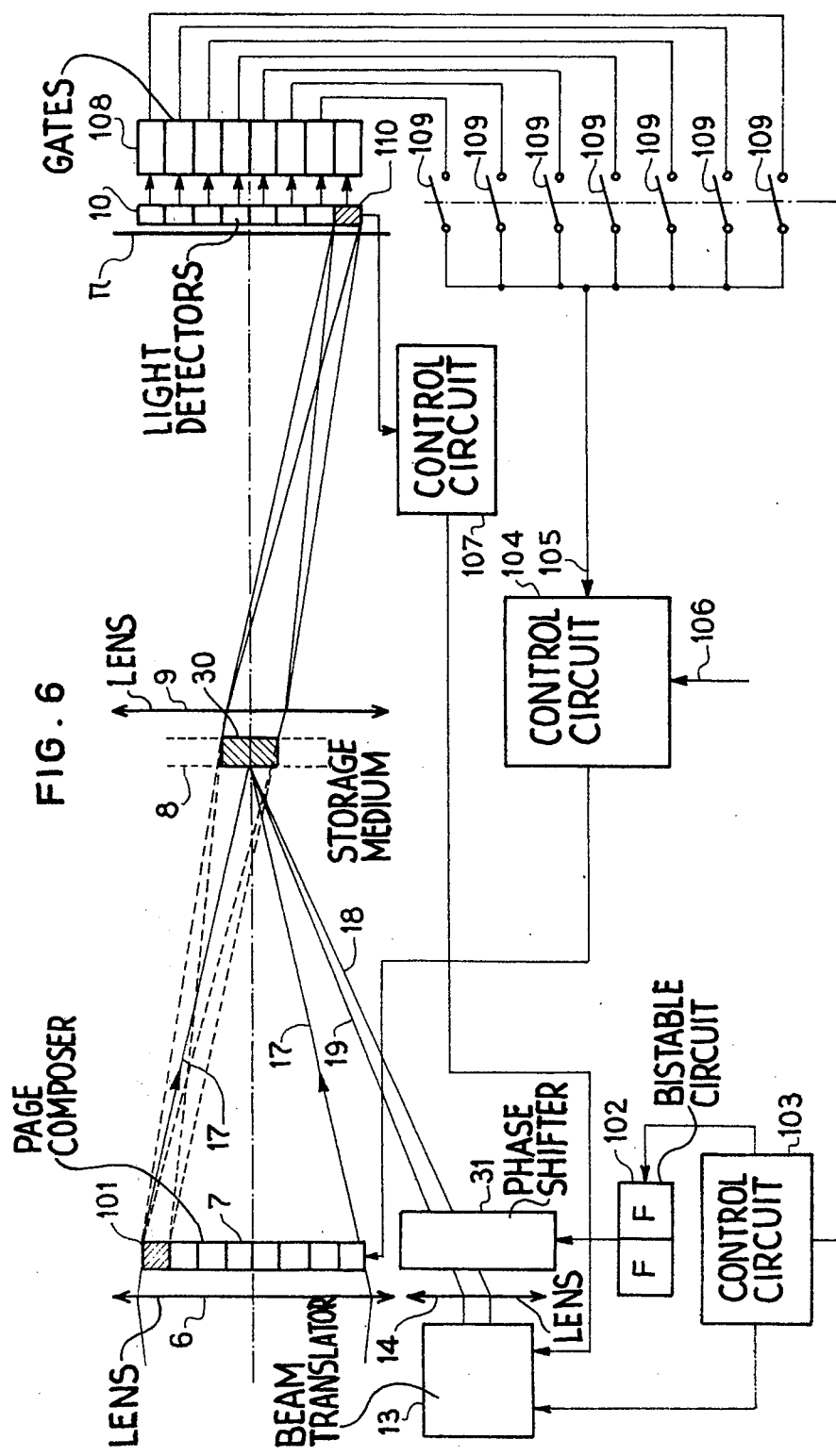
FIG. 6 illustrates a selective erase system making it possible to partially erase the data contained in a page.

In FIG. 1, there can be seen a system for the optical storage of binary data arranged in page form. This is a known system in which an incident piece of binary information $D_I$ can be marked by an address comprising six positional address referenced U, V, X, Y and Z.

The optical part of the storage system shown in FIG. 1 comprises a coherent radiation source 1 which emits a beam of radiated energy in the direction of an X and Y deflector 2. The beam emerging from the deflector 2 has been shown in two positions 15 and 22 corresponding to separate addresses X and Y supplied to the control circuit 12. A semi-transparent plate 3 splits the deflected beam into an object beam 15 or 22 which passes through a shutter 4 before reaching a network 5 of lenses, and a reference beam 23 or 24 which is reflected at a mirror 11 before being applied to the input of a beam translator 13. The lenses which make up the network 5 are used to convert the object beam 15 or 22 into a divergent object beam 16 or 25 which completely illuminates the pupil of the lens 6. By means of the lens 6, the object beam 16 or 25 is concentrated upon the data carrier 8 at holographic storage zones which are cross-hatched in FIG. 1. The data carrier 8 consists of holographic recording zones 30 which are seen frontally at (b) in FIG. 1. The addresses X and Y represent the co-ordinates of the zones 30 on the data carrier 8 and correspond to a zone selection which is performed by means of the deflector 2. It will be seen, in other words, that the position 15 on the part of the deflector beam corresponds with the convergent object beam 17, and that the position 22 on the part of the deflected beam corresponds with the convergent object beam 26. It will be seen, furthermore, that on leaving the lens 6 the object beam 17 or 26 passes through a page composer device 7 the front view of which is given at (a) in FIG. 1.

The page composer 7 is constituted by a mosaic of elementary optical modulators 29 which spatially modulate the object beam whatever orientation it may acquire.

Each elementary optical modulator 29 is marked by its coordinates U and V and by an all or nothing process translates the value of a binary datum (piece of information) for storage. Thus, the binary value 0 can be translated by the non-transmission of the object beam in the corresponding position, and the binary value 1 by the free transmission of the object beam in said same position. It is the circuit 12 which receives the incident data $D_I$, which assigns them, in accordance with the addresses U and V, to the different modulating zones 29 of the page composer 7.

In order to holographically record the pages of data furnished by the composer 7, in the appropriate zones of the data carrier 8, it is not sufficient merely to shift the object beam to these storage zones. It is also necessary for the reference beam coming from the beam translator 13, to intersect the object beam at the centre of each storage zone.

This is achieved by means of a lens 14 whose focal plane is in the plane of the data carrier 8. By means of this lens 14, the reference beam 18 or 27 shown in full line is made to intersect the reference beam 17 or 26 whatever the orientation produced by the deflector 2.

The function of the beam translator 13 is to give the reference beam several directions of incidence upon the data carrier 8 in order to make it possible to superimpose several data pages on one and the same zone of the data carrier 8. This orientation is defined by the address Z furnished to the control circuit 12. If the data carrier 8 has a thickness e which is large compared with the wavelength of the recording radiation, then the Bragg effect provides a means of separately effecting readout of elementary holograms superimposed in one and the same zone. However, if the thickness of the data carrier 8 is sufficient to be able to utilise Bragg effect selection, then the system must be restricted to recording a single hologram per zone of the data carrier 8. In this case, the beam translator 13 becomes superfluous and the address Z is not required. Similarly, if the data carrier 8 has only a single recording zone, the deflector 2 is also superfluous and the addresses X and Y can be discarted as well. Then, only the addresses U and V remain, these being concerned with the composition of a single data page.

The recording of a hologram presumes that the shutter 4 is open since the object beam must be placed in a state of interference with the reference beam. To read out a hologram, the shutter 4 is closed and the reference beam does duty as read-out beam. The radiation diffracted by the hologram which is read-out is picked up by a lens 9 which projects it in the manner indicated by the dashed rays 21, on to a read-out plane $\pi$. In the plane $\pi$ the real image of a data page is formed. Scanning of this image is effected by a mosaic of photo-electric elements 10 which supply to the circuit 12 the read-out data $D_0$, in this circuit the data being ordered in accordance with the locating addresses U and V.

The storage system which has been described does not enable the binary data contained in any particular one of the numerous holographically stored pages, to be erased. The only possibility here is to completely erase a zone of the data carrier 8 provided that the latter lends itself to that procedure.

To achieve selective erasing of the binary data which go to make up a single page or even a fraction of such a page, the invention provides for the utilisation at the position of the data carrier 8, of a special holographic storage material. The recording and erasing of data implies that the use of a photographic emulsion as a storage material must be rejected since it is not possible, after photochemical processing of this kind of data carrier, to modify the information which is stored there.

The storage of phase holograms can be carried out based upon the formation within the volume of a refractive material, of spatial variations in refractive index. The phase holograms obtained in this way are constituted by patterns of three-dimensional or two-dimensional fringes and it is possible to fully erase them in certain instances by uniform heating or illumination.

The selective erasing proposed in accordance with the present invention does not involve the overall removal of a refractive index pattern within the body of the storage material, but instead its modification by the re-recording of the data which are to be erased with a different fringe configuration from that utilised for an initial recording.

In FIG. 2, the essential elements of a selective erase storage system have been shown. As in FIG. 1, there can be seen a holographic storage data carrier which receives an object beam 17 concentrated upon a storage zone 30 by a lens 6, and a reference beam 18. A page composer 7 optically modulates the object beam by means of the binary data furnished from a control circuit 120. An optical phase-shift device 31 has been arranged in the path of the reference beam so that on the occasion of two successive holographic recordings, it is possible to choose between a first phase value and another which is shifted by $\pi$.

In a first phase of operation, the control circuit 120 acts upon the optical phase-shift device 31 in such a manner that the reference beam has a first phase-shift value in accordance with which recording of the data page is carried out. This results in the form of a refractive index pattern or grating within the body of the zone 30. This refractive index pattern or grating makes it possible, under the isolated effect of the beam 18 doing duty as read-out beam, to reconstruct the image of the data page in read-out plane $\pi$. If, then, a second recording of the data page is carried out with the reference beam phase-shifted by 180°, then it will be observed at the time of read-out that the image has been erased more or less completely. If the photo-induced variation in the refractive index of the the storage material takes place linearly as a function of the amplitude of the photo-inductive radiation and if the two recordings have been carried out in identical ways except as far as the beam phase-shift is concerned, then virtually complete erasing of the data page will be achieved.

For this process of erasing to take place properly and for it to be capable of being repeated as many times as required, it is necessary for the storage material to satisfy certain conditions.

One of these conditions is concerned with the form of the variations in the refractive index in relation to time. In FIG. 3, the variation $\Delta n$ in refractive index, observed when a recording photo-inductive radiation is applied, between the instants 0 and $t_1$, has been plotted. We are concerned here with an iron-doped lithium niobate sample. During the phase of recording a refractive index pattern or grating a uniform increase in the variation of the refractive index is observed, which achieved its peak magnitude at the instant $t_1$. Beyond the instant $t_1$, it is necessary to apply to the refractive index grating a read-out beam which produces only a small reduction in the variation in refractive index, which was acquired at the time of the recording phase. It will be seen therefore, that the storage material has a high sensitivity at the time of recording since the photo-inductive illumination is then constituted by a pattern of interference fringes. By contrast, at the read-out phase, since the applied illumination is uniform, the variation in refractive index effectively resists erasing. The storage material is the better the wider the range of refractive index variation within which the index change is linear between 0 and $t_1$.

Another important feature of the storage material is that is should retain its initial refractive index after several recording and erase cycles.

In FIG. 4, the behaviour of an appropriate storage material has been illustrated. We are concerned here once again with the iron-doped lithium niobate referred to earlier. At (a) in FIG. 4 it can be seen that a first recording has given rise to a spatial variation in refractive index $n$ represented by the graph 33. The line 32 represents the refractive index $n_o$ before any recording had taken place.

In FIG. 4, at (b) there can be seen the variation in refractive index after a second recording operation designed to erase the first. The refractive index has regained its initial value $n_o$, represented by the full line 35. In FIG. 4, there have been added in the form of the dashed lines the graphs 33 and 35 which represent the spatial variations in refractive index which the two recording operations would have brought about if they had not been executed one after the other.

In FIG. 5, an illustration has been given of what happens if by way of storage material certain photopolymers are used. The first recording again produces a spatial variation in refractive index represented at (a) in FIG. 5. But on the occasion of the second recording operation, designed to erase the first, it will be seen that the spatial variation in refractive index is not completely erased. It will also be observed from the position of the graph 35 as (b), that the final state following two recordings has given rise to a uniform increase in refractive index, the latter acquiring the value $n_{01}$ instead of staying equal to $n_0$. This storage material evolves in a non-reversible fashion under the effect of repeated irradiation operations and tends towards a saturation condition in which its refractive index, although constant, is no longer capable of modification. A storage material whose behavior is of the kind illustrated in FIG. 5, is unsuitable for the present purpose.

To summarise the properties which the storage material in accordance with the invention must exhibit, it will be seen that we are concerned with a material the photo-induced change in whose refractive index is completely reversible and is subject to a spatial variation in the amplitude of the photo-inductive radiation. These properties are encountered in the case of iron-doped lithium niobate because this is a class of electrically double-refracting materials in which the spatial variations in refractive index are brought about by migrations of electrical charge carriers. These migrations are photo-induced by the alternation of dark zones and zones illuminated by the photo-inductive radiation.

The disposition adopted in FIG. 2 applies the change in phase occurring between the recording phase and the erase phase, to the reference beam 18. The situation would in no way be altered if the phase change were to occur in the object beam. The optical phase-shift device 31 can therefore influence any of the beams used to record the holograms. If the page composer 7 is of the kind which modulates the phase of the object beam 17, it can be used to introduce the phase change. By way of nonlimitative example, the optical phase-shift device 31 may be constituted by an electro-optical cell or by a mobile mirror surface which can occupy two given positions.

Referring to FIG. 2, we have seen that a page of binary data recorded with a given orientation on the part of the reference beam, could be completely erased by re-recording said page whilst reversing the phase of one of the recording beams 17 and 18.

The technique of selective erasing applies equally to the case where a storage zone 30 incorporates a superimposition of the holograms relating to several binary data pages. It is also applicable to the partial erasing of the data contained in a page.

In FIG. 6, a partial diagram of a selective erase storage system which makes it possible to erase one of a set of superimposed pages within a storage zone 30, or simply to erase part of the content of one page, can be seen.

In FIG. 6, it will be seen that the reference beam can have different orientations thanks to the presence of a beam translator 13 associated with the lens 14. The control circuit 103 may for example give the reference beam the two orientations 18 and 19 which correspond to the recording of two binary data pages the holograms for which are superimposed in the storage zone 30. In addition, the control circuit 103 may determine two phase-shift values on the part of the reference beam since it controls a bistable trigger stage 102 which alternately imposes two phase-shift values upon the optical phase-shift device 31. Thus, depending upon the state of the trigger stage 102, a change is made from recording of binary data to their erasing, and vice versa.

In FIG. 6, the page composer 7 is associated with a control circuit 104 having an input 106 which receives the binary data for recording, and an input 105 to which there are applied the binary data already recorded and which are to be erased. The mosaic of photodetector elements 10, which is used to read-out the reconstructed pages projected on to the read-out plane $\pi$, supplies an assembly 108 of storage cells whose outputs are connected to the input 105 of a control circuit 104 by a set of contact breakers 109. These latter can be opened or closed under the selective control of the circuit 103.

When a page of binary data has been recorded within the volume of the storage zone 30, and when it is decided to completely or partially erase these, then a start is made by reading out the particular page. To this end, the object beam is occulted and the appropriate orientation is selected for the reference beam. The binary data which are read out are available at the outputs of the mosaic 10 and are transferred to the storage cells 108. To effect complete erasing of the page, all the contact breakers 109 are closed and the assembly of binary data read-out is applied to the input 105 of the circuit 104 which controls the operation of the page composer 7. The control circuit 103 causes the trigger stage 102 to change state and the phase-shift introduced by the phase-shift device 31 changes suddenly through 180°. The occultation of the object beam 17 is then removed in order to bring about the erasing of the page by re-recording in anti-phase. To effect partial erasing of the data contained in a page, only those contact breakers 109 corresponding to the data which are to be erased, are closed. It goes without saying that the erasing of a data page does not affect the other pages superimposed within the volume of the storage zone 30. Since the page selection function is based upon the precise orientation of the reference beam, and since the latter depends upon the beam translator 13, it is possible to utilise a control technique in order to arrange that the reference beam is properly orientated for the purpose. This technique consists in providing in each page composed or read-out, a storage position which always has the binary value I.

In FIG. 6, this reference storage position is the position 101 and it corresponds in the read-out plane $\pi$ with a photodetector element 110. At the time of readout of the page, the photodetector element 110 is supplied with an illumination which is maximum if the reference beam is properly orientated. In the case of any orientation error, the Bragg effect will show up a reduction in the intensity received by the element 110. A circuit 107 supplied with the electrical signal coming from the photodetector 110 can then produce a correcting signal which corrects the error in the orientation of the reference beam. The error-correcting signal coming from the control circuit 107 is applied to an auxiliary control input of the beam translator 13.

In the contex of the description of FIG. 6, we have seen that the storage system in accordance with the invention makes it possible to substitute for a binary value 1 a binary value 0 by virtue of the selective erasing property and that it is possible also to perform the opposite function at the time of a fresh recording.

It is therefore possible to utilise the selective erase recording system in order to perform certain logic operations such as logic inversion, the "EXCLUSIVE-OR" operation and the "OR" operation.

The logic inversion operation performed on the binary data on a page is carried out by recording a page composed exclusively of binary 1 values, as if it were page erasing which were being carried out. It is merely necessary for this purpose to connect the input 105 and all the contact breakers 109 to a reference voltage representing the binary value 1.

The logic OR operation concerns two or more different pages. This can be performed by reading-out one page and utilising the read-out data for a second recording of another page without producing any change in phase by triggering of the trigger stage 102. The same procedure is continued in relation to the other pages.

The EXCLUSIVE-OR logic operation is concerned with two different pages. It is similar to the OR operation but requires that the trigger stage 102 is made to change state between the first and second recordings of the page in respect of which this logic operation is to be performed.

What we claim is:
1. An optical storage system for selectively erasable binary data arranged in pages holographically recorded within a photosensitive medium, said system comprising: a source of coherent radiation, a photosensitive medium for storing said binary data, first optical means splitting said coherent radiation into an object beam and a reference beam, a page composer device optically modulating said object beam in accordance with said binary data, second optical means causing said modulated object beam and said reference beam to intersect one another for effecting selective holographic recording and erasing of said pages within at least one portion of said photosensitive medium, third optical means cooperating with said reference beam, for selectively reading out the elementary hologram photo-induced in said photosensitive medium, and optical phase-shift means acting upon the phase of one of said beams in order to introduce an optical phase-shift acquiring the respective values 0 and $\pi$ for respectively effecting recording and erasing of said pages; said photosensitive medium being constituted by an electrically birefringent material undergoing a change in refractive index photo-induced by said coherent radiation; said photo-induced change in refractive index being caused by a reversible optical damage effect occuring in relation with a spatial variation in the amplitude of said coherent radiation.

2. An optical system as claimed in claim 1, wherein said photosensitive medium takes the form of a plate having a thickness substantially greater than the wavelength of said coherent radiation; said system further comprising fourth optical means transmitting said reference beam toward said portion of photosensitive medium; said fourth optical means changing the direction of incidence of said reference beam for selectively storing and erasing data pages corresponding to a plurality of elementary holograms superimposed in said portion of photosensitive medium.

3. An optical system as claimed in claim 1, wherein said photosensitive medium comprises several adjacent storage zones, further comprising beam displacing means arranged on the path of said coherent radiation, acting with said second optical means for effecting selective holographic recording of said pages within anyone of said several adjacent storage zones.

4. An optical system as claimed in claim 1, wherein said optical phase-shift means are arranged in the path of said reference beam; said optical phase shift means comprising an electrically controlled optical phase modulator.

5. An optical system as claimed in claim 1, said optical phase shift means are combined with said page composer device; said page composer device being capable of producing in the trajectory of said object beam, a uniform phase-shift of 0 or 180°.

6. An optical system as claimed in claim 2, wherein said fourth optical means comprise means acting upon the orientation of said reference beam during the selective read out of said elementary holograms for adjusting said orientation exactly like the orientation of said reference beam during the corresponding recording.

7. An optical system as claimed in claim 1, wherein said third optical means comprise a matrix of photodetector elements scanning one by one the images of said data pages reconstructed from said elementary holograms; a set of storage elements being connected to said photodetector elements for temporarily retaining the binary data contained in anyone of said read out data pages.

8. An optical system as claimed in claim 7, wherein at least one fraction of the binary data stored in said storage elements, is applied to said page composer device for effecting their selective erasure in the course of an erase phase.

9. An optical system as claimed in claim 7, wherein for effecting the operation of logic inversion of the binary data contained in one of said data pages control means producing selective erasure are employed; binary data all having the same value being applied to said page composer device in the course of an erase phase.

10. An optical system as claimed in claim 7, wherein for effecting the logic OR operation on the binary data contained in a first stored data page and a second stored data page, control means act to apply to said page composer device binary data pertaining to the read out of said first data page, this taking place during the course of a phase of re-recording similar to the phase of recording of said second data page.

11. An optical system as claimed in claim 7, wherein for effecting the logic EXCLUSIVE OR operation on the binary data stored in a first data page and a second data page, control means act to apply to said page composer device binary data pertaining to the read out of said first data page, this taking place during the course of an erase phase corresponding to the phase of recording ot said second data page.

12. An optical system as claimed in claim 1, wherein said photosensitive medium is constituted by iron-doped lithium niobate.

* * * * *